United States Patent [19]

Brewerton et al.

[11] 4,422,053
[45] Dec. 20, 1983

[54] FREQUENCY MODULATOR INCLUDING FREQUENCY SYNTHESIZER

[75] Inventors: David Brewerton, Bracknell; Peter P. R. Connell, Marlow, both of England

[73] Assignee: Racal-Dana Instruments Limited, Bracknell, England

[21] Appl. No.: 300,280

[22] Filed: Sep. 8, 1981

Related U.S. Application Data

[62] Division of Ser. No. 123,267, Feb. 21, 1980, Pat. No. 4,322,692.

[30] Foreign Application Priority Data

Mar. 6, 1979 [GB] United Kingdom ............... 7907795

[51] Int. Cl.$^3$ .............................................. H03C 3/00
[52] U.S. Cl. ..................................... 332/16 R; 332/19; 455/112
[58] Field of Search ............. 332/16 R, 19; 455/42, 455/110, 112, 113

[56] References Cited

U.S. PATENT DOCUMENTS 2,114,333  4/1938  Conklin ............................. 455/112
2,813,977  11/1957  Carter ............................. 455/112 X
3,334,300  8/1967  Pischke et al. ..................... 455/42 X

FOREIGN PATENT DOCUMENTS 724942   2/1955  United Kingdom .
790807   2/1958  United Kingdom .
1112981  5/1968  United Kingdom .
1173203  12/1969 United Kingdom .
1177010  1/1970  United Kingdom .
1180351  2/1970  United Kingdom .
1192680  5/1970  United Kingdom .
1301840  1/1973  United Kingdom .

Primary Examiner—Siegfried H. Grimm
Attorney, Agent, or Firm—Leydig, Voit, Osann, Mayer & Holt, Ltd.

[57] ABSTRACT

A synthesizer is disclosed having a frequency modulation phase-locked loop incorporating a voltage controlled oscillator (VCO) producing a 100 MHz, say, carrier which can be frequency-modulated. The VCO output is combined in a mixer with the output of another VCO which is variable stepwise. A frequency divider with a division factor of, say, 10, can be selectively interposed in the output of the VCO by means of a switch, and the resultant divided output is summed with a fixed frequency of, say, 90 MHz so as bring the output back to the 100 MHz carrier frequency. In this way, not only is the FM reduced by a factor of 10 (in this example) but so is the noise.

2 Claims, 4 Drawing Figures

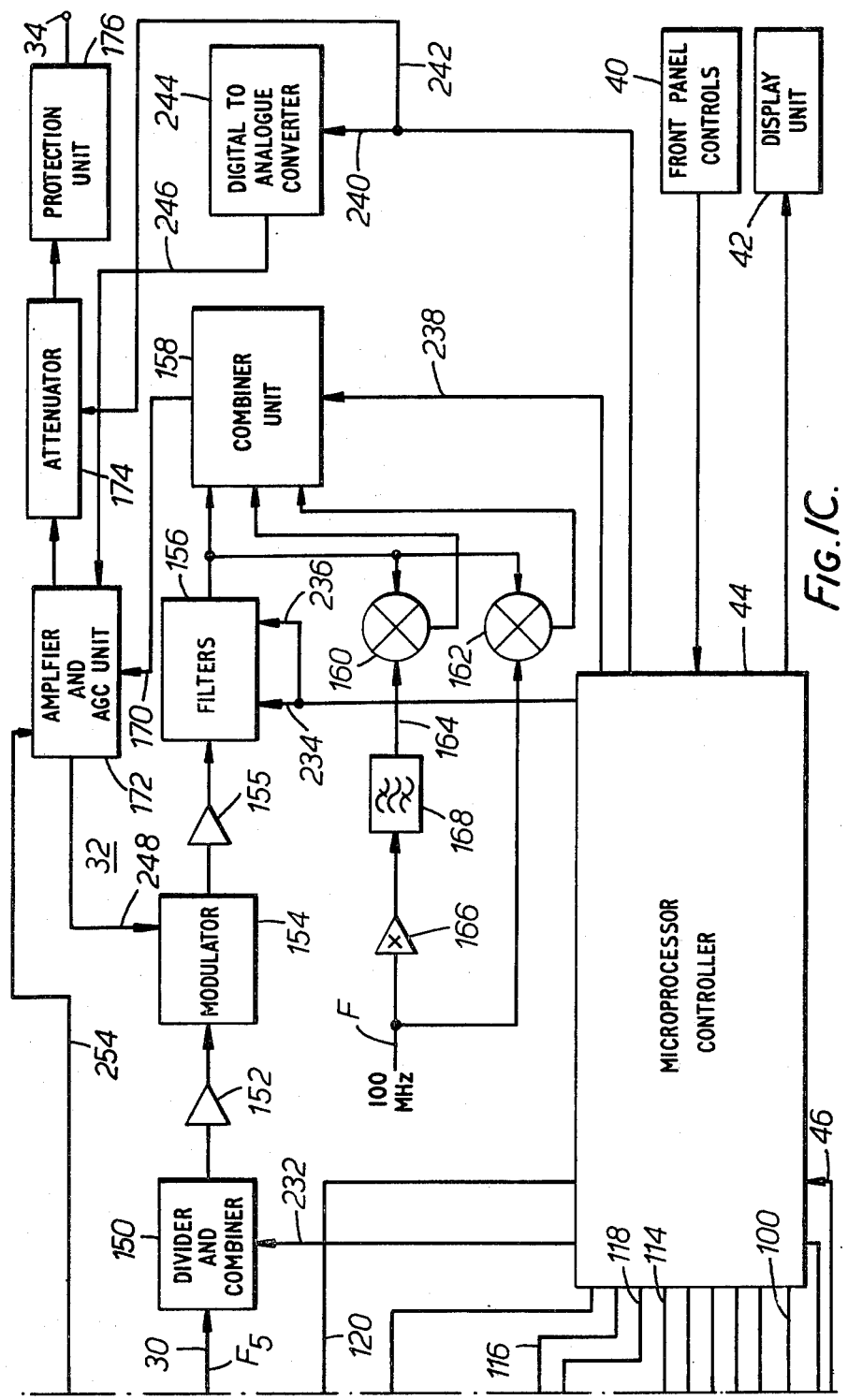
FIG. IC.

FREQUENCY MODULATOR INCLUDING FREQUENCY SYNTHESIZER

This is a division of application Ser. No. 123,267, filed Feb. 21, 1980 now U.S. Pat. No. 4,322,692.

BACKGROUND OF THE INVENTION

The invention relates to electrical circuit arrangements and more particularly to electrical frequency synthesising and signal generator circuits.

BRIEF SUMMARY OF THE INVENTION

According to the invention, there is provided an electrical circuit arrangement for producing a variable output frequency lying within a predetermined range and variable in frequency steps each of predetermined size, comprising adjustable frequency generating means connected to produce the variable output frequency, first reference means producing a first reference frequency variable stepwise, frequency combining means for algebraically combining the variable output frequency with the first reference frequency so as to produce outputs corresponding to the sum and difference of the two frequencies, frequency dividing means having a variable frequency division factor and connected to receive the sum and difference outputs, comparing means selectively operative to compare either the sum or the difference output, after division by the variable division factor, with the second reference frequency so as to produce a control signal dependent on the value of any error between the two frequencies compared, means responsive to the control signal and connected to adjust the said variable frequency so as to reduce the error to zero, and control means for rendering the comparing means responsive either to the sum or to the difference output, and for determining the value of the first reference frequency, in accordance with the position in the said predetermined range where the desired value of the output frequency lies and for adjusting the division factor by the minimum possible amount in order to change the value of the output frequency by one step of the predetermined size.

According to the invention, there is also provided an electrical circuit arrangement for producing a frequency modulated output frequency having a predetermined carrier frequency, comprising adjustable frequency generating means producing a first frequency signal having a predetermined nominal value, frequency modulating means for adjusting the first frequency signal over a predetermined range which is a small fraction of the nominal value, including means producing a fixed frequency signal such that the sum of its value and the value of the nominal frequency divided by a fixed division factor is the same as the predetermined carrier frequency, a frequency divider connected to divide the frequency modulated first frequency signal by the said fixed division factor, and adding means for adding the fixed frequency signal to the divided frequency modulated first frequency signal to produce the said output frequency.

DESCRIPTION OF THE DRAWINGS

An electrical frequency synthesising arrangement embodying the invention will now be described, by way of example, with reference to the accompanying diagrammatic drawings in which.

DESCRIPTION OF PREFERRED EMBODIMENTS

Figure 1A:
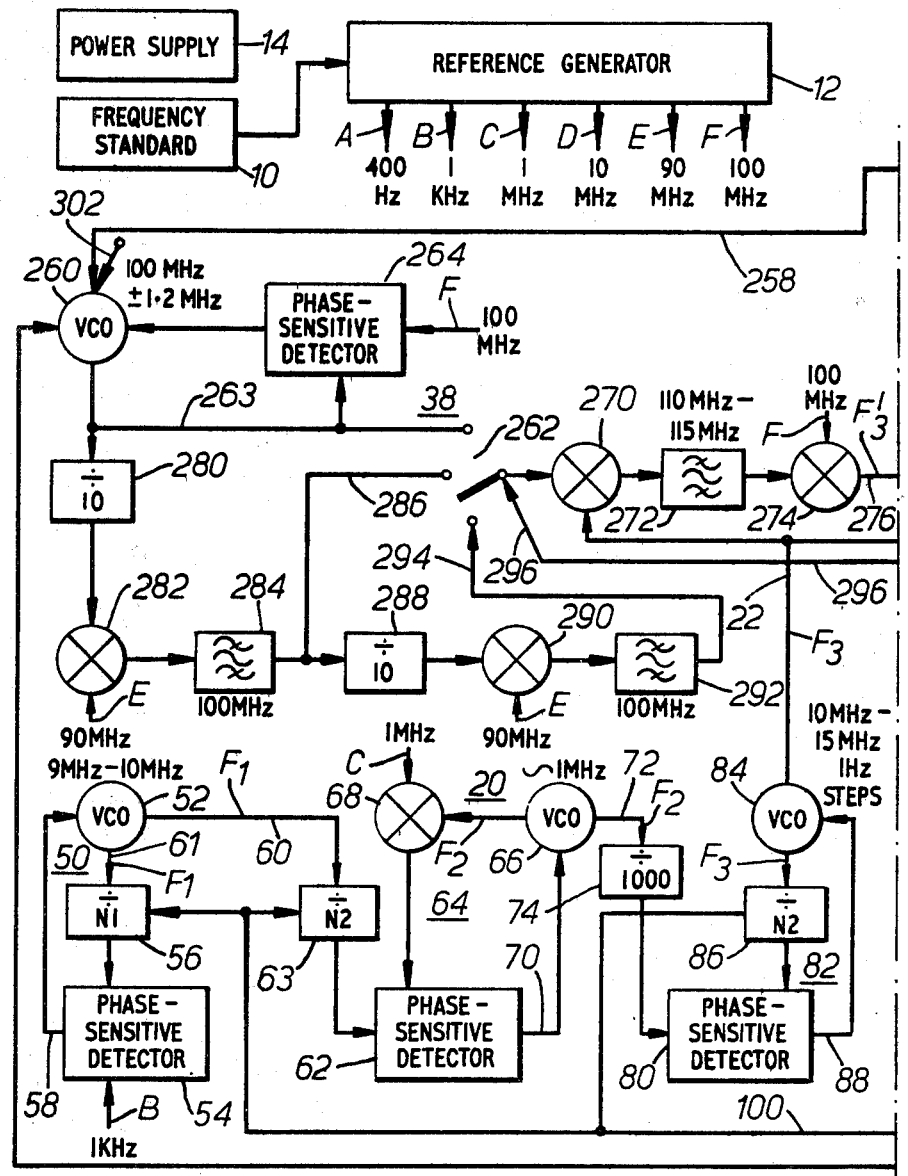
FIGS. 1A, 1B and 1C, when joined as shown in FIG. 1, together form a block circuit diagram of the circuit arrangement.

The circuit arrangement to be described is for producing an electrical output in the range 10 KHz to 1300 MHz variable in 1 Hz steps.

The circuit arrangement incorporates an accurate frequency standard unit 10 which controls a reference generator 12. The reference generator produces six accurately controlled outputs on lines A (400 Hz), B (1 KHz), C (1 MHz), D (10 MHz), E (90 MHz) and F (100 MHz). The lines A to E are connected to various points in the circuit arrangement as will be described. In the Figures, the actual connections are omitted but are indicated by the relevant letters A to F.

The circuit arrangement also includes a power supply 14. The lines connecting this to the various part of the circuit arrangement are omitted from FIG. 1.

The circuit arrangement comprises a low frequency section 20 which can be controlled to produce a frequency on a line 22 in the range 10 to 15 MHz variable in 1 Hz steps, a comb loop 24 which can be controlled to produce a frequency on a line 26 in the range 390 MHz to 1310 MHz variable in 10 MHz steps, a combining section 28 which combines the outputs of the low frequency section 20 and the comb loop 24 to produce an output on a line 30 in the range 400 MHz to 1300 MHz variable in 1 Hz steps, and an output section 32 which modifies and controls the output from the combining loop 28 and feeds it to an output terminal 34. In addition, the circuit arrangement includes audio circuits 36 which generate audio signals for amplitude and frequency modulation, an FM section 38 which applies the FM to the circuit arrangement, front panel controls 40 for setting up the desired frequency, a display unit 42 for displaying the output, and a microprocessor controller 44 which responds to the front panel controls 40 and sets up the various parts of the circuit arrangement (as will be explained) in order to produce the required output.

The microprocessor controller 44 may also be connected by means of a line 46 to a General Purpose Interface Bus 48 (or other suitable means) to enable it to be controlled automatically and/or remotely or as part of some system.

The low frequency synthesising section 20 comprises a first phase-locked loop 50 having a voltage controlled oscillator (VCO) 52 operating in the range 9 to 10 MHz. The output of the VCO 52 is fed to a phase sensitive detector 54 via a divider 56 having a division factor of $N_1$. The second input of the phase sensitive detector 54 is fed with a 1 KHz signal from the output line B of the reference generator 12.

The phase sensitive detector 54 responds to any phase difference detected between its two inputs and produces a control output on a control line 58 which adjusts the frequency, $F_1$, of the VCO 52 so as to bring the two inputs of the phase sensitive detector 54 into phase. Therefore, the VCO 52 produces an output frequency $F_1$, where $$F_1 = 10^3 \times N_1 \tag{1}$$

on lines 60 and 61.

Line 60 feeds $F_1$ to one input of a phase sensitive detector 62 via a divider 63 having a division factor of $N_2$. The detector 62 forms part of a second phase-locked loop 64. This loop includes a VCO 66 operating at approximately 1 MHz which feeds its output to the second input of the phase sensitive detector 62 via a mixer 68 which receives a 1 MHz reference signal on the line C of the reference generator 12.

The phase sensitive detector 62 responds to any phase difference between its two inputs and produces a control output on a line 70 which adjusts the VCO 66 until its output frequency, $F_2$, brings the two inputs to the detector 62 into phase equality. At phase equality, therefore, $$\frac{F_1}{N_2} = F_2 - 10^6 \quad (2)$$

But $F_1 = 10^3 \times N_1$ from Equation (1).
Therefore, $$F_2 = \frac{10^3 \times N_1}{N_2} + 10^6 \quad (3)$$

The signal is then fed via a divider 74 having a fixed division factor of 1000 to one input of a phase sensitive detector 80 in a third phase-locked loop 82. This loop includes a VCO 84 operating in the range 10 to 15 MHz and producing an output frequency $F_3$ which is fed to the second input of the phase sensitive detector 80 through a divider 86 having a division factor of $N_2$.

The phase sensitive detector 80 responds to any phase error between its two inputs to produce a control output on a control line 88 which adjusts the frequency of the VCO 84 until the two inputs to the detector are brought into phase equality. At phase equality, therefore, $$\frac{F_3}{N_2} = \frac{F_2}{10^3}$$

Therefore, $$F_3 = \frac{F_2 \times N_2}{10^3}$$

Substituting from Equation (3), $$F_3 = \left( \frac{10^3 \times N_1}{N_2} + 10^6 \right) \times \frac{N_2}{10^3}$$

Thus, $$F_3 = N_1 + 10^3 \cdot N_2$$

Therefore, if $N_1$ is arranged to vary between 9000 and 10000 and $N_2$ is arranged to vary between 9991 and 14990, $F_3$ will vary between 10 and 15 MHz. A unit change in $N_1$ will vary $F_3$ by 1 Hz, while a unit change in $N_2$ will vary $F_3$ by 1 KHz.

The division factors of the dividers 56 ($N_1$), 61 ($N_2$) and 86 ($N_2$) are controlled by the microprocessor controller 44 by means of a control channel 100.

The output frequency $F_3$ from the VCO 84 is fed via the line 22 and a switch 102 to the combining loop 28 where it is combined (in a manner to be described) with the output from the comb loop 24.

The comb loop 24 comprises a phase-locked loop 104 having a VCO unit 106 operating in the range 390 MHz to 1310 MHz and producing an output $F_4$. This output is fed via a mixer 107 and a divider 108 having a variable division factor $N_3$ to one input of a phase sensitive detector 110.

The second input of the phase sensitive detector 110 is fed with a reference of 10 MHz via the line D from the reference generator 12.

The loop 24 also includes a multiplier 112 which receives a reference of 100 MHz on the line F from the reference generator 12 and therefore produces an output comprising a range of harmonics of 100 MHz which are fed to an adjustable bandpass filter 114 which can be set to select any of these harmonics, the selected harmonic being the ($N_4$)th harmonic, where $N_4$ is variable. The selected harmonic is then fed to the mixer 107 which feeds the sum and difference outputs to the divider 108 and thence to the phase sensitive detector 110.

Therefore, $$\frac{F_4 \pm 10^8 \cdot N_4}{N_3} = 10^7$$

Thus, $$F_4 = 10^7 \cdot N_3 \pm 10^8 \cdot N_4$$

Therefore, a unit change in the value of $N_3$ would change $F_4$ by 10 MHz. At the lower end of the range of $F_4$, the phase detector 110 is switched to lock the difference output from the mixer 107 (via divider 108) to the 10 MHz reference, while at the higher end of the range $F_4$, the phase detector is switched to lock the sum output of the mixer (via divider 108) to the 10 MHz reference. Switching of the phase detector 110 between its two settings is carried out by the microprocessor controller 44 by means of a control channel 114. The microprocessor controller 44 also controls the values of $N_3$ and $N_4$ by means of control channels 116 and 118.

Because of the range to be covered by $N_4$, the VCO unit 106 comprises two VCO's each covering part, only, of the range, and the controller 44 selects one or other of these VCO's, according to the required value of $F_4$, by means of a control channel 119.

The phase-locked loop 104 will not be able to lock up unless $F_4$ is at approximately the right value, say within 50 MHz. Therefore, the controller 44 is arranged to set the VCO unit 106 to approximately the correct frequency by means of a control channel 120 which feeds a digital signal representing the desired frequency to a digital to analogue converter 122 whose analogue output sets $F_4$ to approximately the correct value.

The output $F_4$ of the comb loop 24 is fed to one input of a mixer 130 forming part of the combining loop 28. The combining loop 28 is in the form of a phase-locked loop incorporating a phase-sensitive detector 132 one of whose inputs is fed from the output of the mixer 130 and the other of whose inputs is fed with the frequency $F_3$ from the low frequency section 20 via switch 102.

The combining loop also incorporates a VCO unit 134 adjustable over the range 400 to 1300 MHz and its output frequency $F_5$ is fed to a second input of the mixer 130, as well as being output on the line 30.

Therefore, $$F_4 \pm F_5 = F_3,$$

and thus $$F_5 = \pm(F_3 - F_4)$$

$F_4$ is variable in steps of 10 MHz, as explained above. Therefore, in order to cover the first half of each decade of MHz in the value of $F_5$, $F_4$ is set to the value at the beginning of that decade, and $F_3$ is then stepped through its 5 MHz range in 1 Hz steps and the phase detector 132 selects the sum output from the mixer 130. In order to cover the second half of each such decade of MHz, $F_4$ is increased by 10 MHz to the frequency at the end of that decade and the value of $F_3$ is reduced over its 5 MHz range in 1 Hz steps, and the phase detector 132 is switched to select the difference output from the mixer 130. Switching of the phase detector 132 is controlled by the microprocessor controller 44 by means of a channel 136.

Again, in order to cover the necessary range, the VCO unit 134 in fact consists of two VCO's each covering part, only, of the range, and the microprocessor controller 44 selects the appropriate VCO by means of a control channel 138. In addition, the output from the digital to analogue converter 122 is used to set the value of $F_5$ to approximately the correct value.

The frequency $F_5$ is fed to the output section 32 on line 30. The output section 32 includes a divider and combiner unit 150 which can be set to divide $F_5$ by 1, 2 or 4 as will be explained in more detail below, and the output is then amplified in an amplifier 152 and passed to a modulating unit 154 for applying amplitude modulation and for controlling the level of the signal. The output of the modulator is then fed through a buffer 155 to a bank of selectable half-octave filters 156 and then to a selecting switch 158. The switch 158 can be set to combine the signal with outputs from two mixers 160 and 162 each of which also receives the signal from the bank of filters 156.

The mixer 160 has its second input fed with a 500 MHz signal on a line 164. This signal is derived by multiplying the 100 MHz reference signal (received on line F from the reference generator 12) in a multiplier 166 and selecting the fifth harmonic by means of a bandpass filter 168.

The mixer 162 has a second input of 100 MHz which is obtained directly from the line F.

The purpose of the divider and combiner unit 150, the half-octave filter 156, the switch 158 and the mixers 160 and 162 is to produce from the 400 to 1300 MHz output, $F_5$, a signal $F_6$ covering the range 10 KHz to 1300 MHz as will be explained in detail. The signal $F_6$ is fed via an output amplifier and AGC unit 172 and a programmable attenuator 174 to the output terminal 34. A reverse power protection unit 176 may be provided, to protect the circuit arrangement against the accidental application of a power signal to the output terminal 34.

Figure 1:
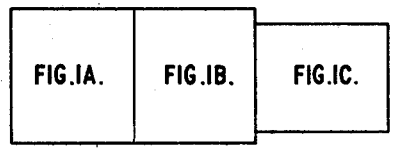
Figure 1B:
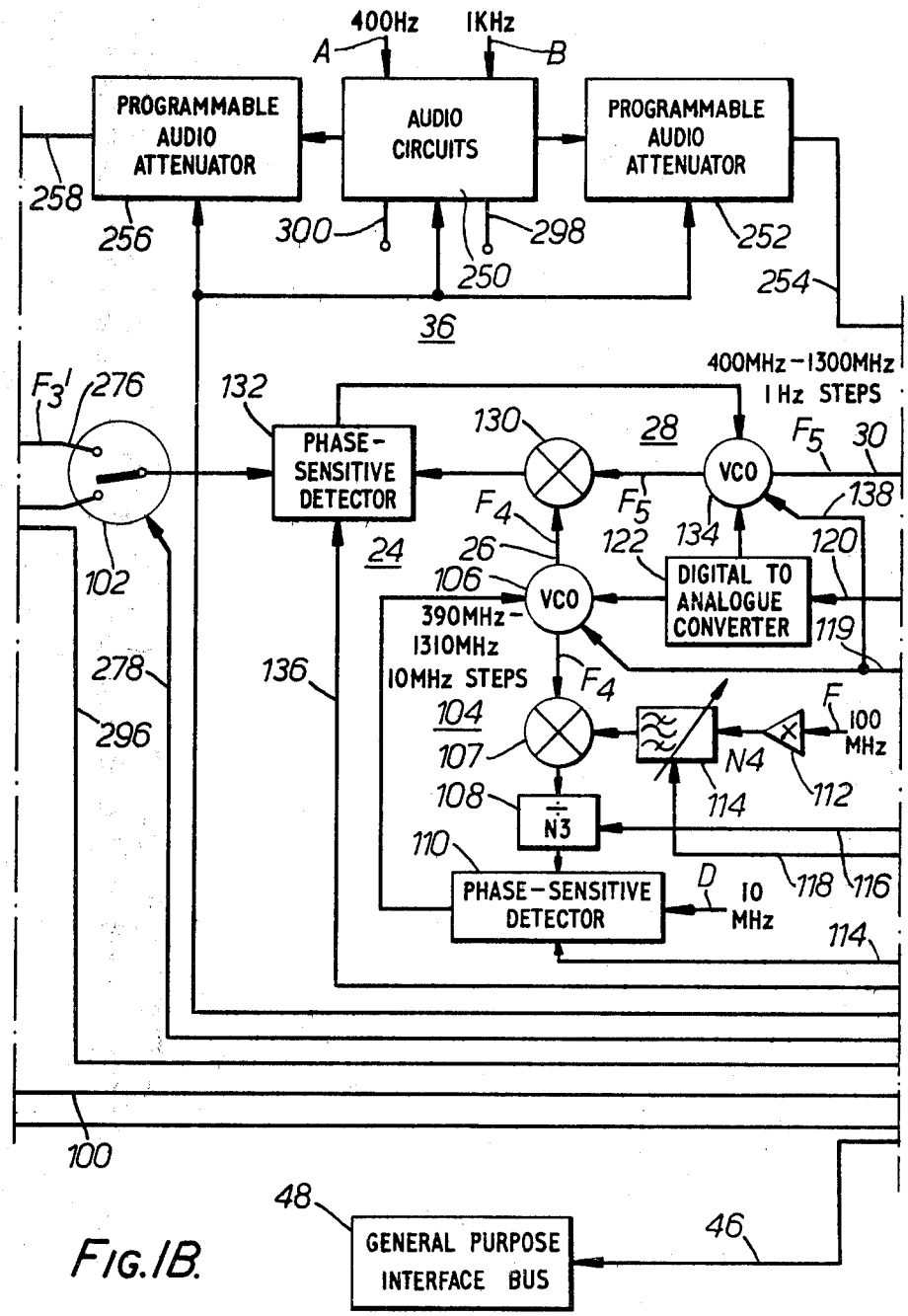
Figure 2:
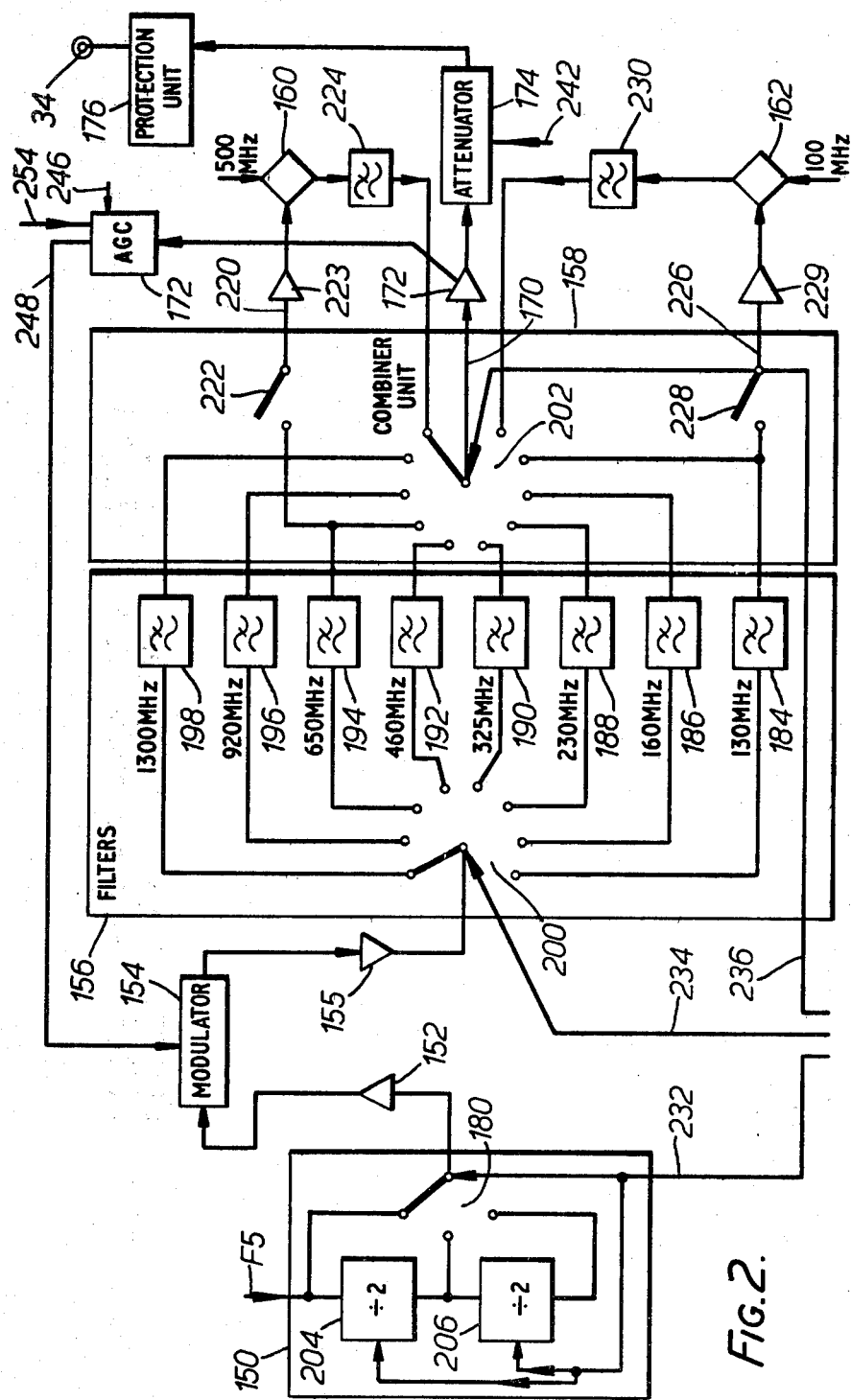
FIG. 2 is a block circuit diagram showing part of the circuit arrangement in greater detail.

The output unit 32 will be described in more detail with reference to FIG. 2 in which items corresponding to those in FIG. 1 are correspondingly referenced.

When the desired value of $F_6$ lies in the range 650 to 1300 MHz, the unit 150 is selected to divide by unity, and a switch 180 in the unit 150 is set so that the signal $F_5$ is fed directly to the amplifier 152 and thence to the modulator 154. The bank of filters 156 includes eight low pass filters 184, 186, 188, 190, 192, 194, 196 and 198 whose upper frequency limits are as shown in FIG. 2. If, therefore, as in this example, $F_6$ lies in the range 650 to 1300 MHz, then one or other of the filters 196 and 198 will be selected according to the actual value of $F_6$, and this selection is achieved by means of switches 158 and 200.

If the desired value of $F_6$ lies in the range 325 to 650 MHz, switch 180 is set to pass $F_5$ through a divide-by-2 divider 204 in the unit 150, and in this case one or other of the filters 192 and 194 in the filter band 156 would be selected by the switches 158 and 200 according to the actual value of the output frequency.

If the desired value of the signal $F_6$ lies in the range 100 to 325 MHz, then the switch 180 would be selected so as to cause the signal $F_5$ to pass through the divider 204 and then through a second series-connected divide-by-2 divider 206. In this case, one of the filters 184, 186, 188 and 190 would be selected by the switches 158 and 200 according to the actual value of the output frequency.

The mixers 160 and 162 are used when the value of $F_6$ is below 100 MHz.

To cover the range 5 MHz to 100 MHz, the mixer 160 is used. Its second input is fed via a line 220, a switch 222 and a buffer 223 from the output of the 650 MHz low pass filter 194. Therefore, the value of $F_5$ is selected (in the range 505 to 600 MHz) so that the difference output from the mixer 160 has the required value to produce, by subtraction from 500 MHz, the correct value for $F_6$. The mixer output is passed via a low pass filter 224 (to reject the sum output) to the switch 158.

The mixer 162 is used when the desired value $F_6$ lies in the range 10 KHz to 5 MHz. In this case, the second input of the mixer 162 is fed via a line 226, a switch 228 and a buffer 229 from the output of the 130 MHz low pass filter 184. In this case, the value of $F_5$ is selected to lie in the range 100.01 MHz to 105 MHz according to the desired value of $F_6$, and a low pass filter 230 selects the difference output from the mixer and passes it to the switch 158.

In order to obtain the desired value for $F_6$, the switches 158, 180, 200, 222 and 228 are appropriately controlled by the microprocessor controller 44 by means of channels 232, 234 and 236.

The level of the output signal at the output terminal 34 is controlled by the programmable attenuator 174 and the AGC unit 172, and this is set by means of the microprocessor controller 44 by means of channels 240 and 242, line 240 controlling a digital to analogue converter 244 (see FIG. 1) which produces an analogue control signal on the line 246 for the AGC unit 172. The AGC unit has a feedback line 248 to the modulator 154 for controlling the level of the desired value. The arrangement of the AGC loop, including the unit 172 and the modulator 154, may be as disclosed in our co-pending British patent application No. 7,901,643 filed Jan. 17, 1979 by the assignees of the present application and in its corresponding United States application Ser. No. 112,734 filed Jan. 17, 1980 by Robert D. Nicholson and now U.S. Pat. No. 4,307,348.

The output at the terminal 34 may be amplitude or frequency modulated as required. Modulation is generated by the circuit section 36 (FIG. 1). This circuit section includes an audio signal generating unit 250 which is fed with 400 Hz and 1 KHz reference signals on lines A and B from the reference generator 12. If the output is to be amplitude-modulated, the modulating signal is fed through a programmable attenuator 252 to the modulating unit 154 on a line 254 via the unit 172.

If the output is to be frequency modulated, the modulating signal is fed via a programmable attenuator 256 and a line 258 to the FM section 38 which will now be described.

The FM section 38 comprises a VCO 260 having a nominal frequency $F_7$ of 100 MHz which is fed to a switch 262 via a line 263 and also to one input of a phase-sensitive detector 264. The second input of the detector 264 receives a 100 MHz reference signal on line F from the reference generator 12. Before any FM signal is applied to the VCO 260 on the line 258, the VCO is accurately set to 100 MHz by means of a narrow bandwidth phase-locked loop including the phase-sensitive detector 264. The FM signal is applied to vary the frequency of the VCO 260 over a maximum range of ±1.2 MHz. The resultant frequency-modulated signal is applied via the switch 262 to one input of a mixer 270 whose second input receives the output $F_3$ on the line 22 from the VCO 84 of the low frequency section 20. The sum output from the mixer 270, lying in the range 110 MHz to 115 MHz, is selected by a band-pass filter 272 and passed to a further mixer 274. Mixer 274 has a second input receiving the 100 MHz reference signal on the line F from the reference generator 12, and the result is to produce a signal $F_3'$ on a line 276, the signal $F_3'$ corresponding to the signal $F_3$ in that it lies in the range 10 to 15 MHz and is variable in 1 Hz steps by the low frequency section 20, but in addition it carries frequency modulation. The signal $F_3'$ is selected by the switch 102 under control of the microprocessor controller 44 by means of a control channel 278, and applied to the combining loop 28.

Instead of feeding the frequency-modulated signal $F_7$ directly to the switch 272, it can be fed through a divide-by-10 divider 280 and thence to one input of a mixer 282 whose second input receives a reference signal of 90 MHz on the line E from the reference generator 12. The sum output, of 100 MHz, is selected by a band-pass filter 284 and can then be fed to the switch 262 on a line 286. In this way, the frequency modulation is reduced by a factor of 10.

The frequency modulation can be reduced by a factor of 100 by feeding the output from the filter 284 into a further divide-by-10 divider 288 and thence to one input of a further mixer 290 whose second input receives the 90 MHz reference signal on the line E. The 100 MHz sum output is selected by a band-pass filter 292 and fed to the switch 262 on a line 294. Switch 262 is therefore set to select line 294 instead of line 286, and the frequency modulation has now been reduced by a factor of 100 compared with the signal on the line 263.

The use of the dividers 280 and 288 for reducing the amount of frequency modulation is advantageous because not only does it reduce the frequency modulation by a factor of 10, or 100, but the value of any noise present is reduced by the same proportion.

The switch 262 is controlled by a control channel 296 from the microprocessor controller 44.

If desired, the audio signal generator 260 can be controlled by externally applying audio signals on control lines 298 and 300 respectively.

Because the maximum range of FM (±1.2 MHz) applied to the VCO 260 is only a very small proportion of the total adjustment range of the VCO, open-loop control of the VCO gives more than sufficient accuracy and linearity.

DC frequency modulation can also be applied, by means of a DC control line 302, phase detector 264 being rendered inoperative.

What is claimed is:

1. An electrical circuit arrangement for producing a frequency modulated output frequency having a predetermined step-wise-variable carrier frequency, comprising adjustable frequency generating means producing a first frequency signal having a predetermined nominal value, frequency modulating means for adjusting the first frequency signal over a predetermined range which is a small fraction of the nominal value, means producing a fixed frequency signal such that the sum of its value and of the said nominal value divided by a fixed division factor is the same as the nominal value, a frequency divider connected to divide the frequency modulated first frequency signal by the said fixed division factor, means producing an intermediate frequency comprising adding means for adding the fixed frequency signal to the divided frequency-modulated first frequency signal, means producing a stepped frequency signal whose frequency is variable over a predetermined range in steps each of predetermined size, combining means connected to combine the stepped frequency signal and the said intermediate frequency, and subtracting means connected to subtract a frequency having the said nominal value from the output of the combining means to produce the said output frequency.

2. An arrangement according to claim 1, in which the means producing the intermediate frequency comprises means producing a second fixed frequency such that the sum of its value and of the said nominal value divided by a second fixed division factor is the same as the said nominal value, a second frequency divider having the second fixed division factor, switch means selectively operative to connect the second frequency divider to divide the sum produced by the adding means by the second fixed division factor, and second adding means for adding the second fixed frequency signal to the output of the second divider to produce the said intermediate frequency.

* * * * *